United States Patent
Kosugi et al.

(10) Patent No.: US 11,217,451 B2
(45) Date of Patent: Jan. 4, 2022

(54) SUBSTRATE PROCESSING METHOD AND SUBSTRATE PROCESSING APPARATUS

(71) Applicant: TOKYO ELECTRON LIMITED, Tokyo (JP)

(72) Inventors: Hitoshi Kosugi, Koshi (JP); Shota Umezaki, Koshi (JP); Kouzou Tachibana, Koshi (JP); Ryo Yamamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/737,526

(22) Filed: Jan. 8, 2020

(65) Prior Publication Data

US 2020/0234998 A1    Jul. 23, 2020

(30) Foreign Application Priority Data

Jan. 17, 2019  (JP) .............................. JP2019-006171

(51) Int. Cl.
 *H01L 21/306* (2006.01)
 *H01L 21/687* (2006.01)
 *H01L 21/67* (2006.01)

(52) U.S. Cl.
 CPC ...... *H01L 21/306* (2013.01); *H01L 21/30604* (2013.01); *H01L 21/67017* (2013.01); *H01L 21/68764* (2013.01)

(58) Field of Classification Search
 CPC ............ H01L 21/306; H01L 21/30604; H01L 21/68764; H01L 21/67017; H01L 21/67028; H01L 21/67051; H01L 21/02057; H01L 21/67034; H01L 21/68792; H01L 21/6715; B05B 9/035; B05B 13/0278; B05B 13/0228
 USPC ......................................... 438/689, 745–754
 See application file for complete search history.

(56) References Cited

U.S. PATENT DOCUMENTS

| | | | | |
|---|---|---|---|---|
| 2013/0228200 | A1* | 9/2013 | Otsuka | H01L 21/67051 134/26 |
| 2016/0093517 | A1* | 3/2016 | Higashi | B08B 3/02 134/33 |
| 2017/0330770 | A1* | 11/2017 | Kim | B08B 3/10 |

FOREIGN PATENT DOCUMENTS

JP    2017-108190 A    6/2017

* cited by examiner

*Primary Examiner* — Duy Vu N Deo
(74) *Attorney, Agent, or Firm* — Nath, Goldberg & Meyer; Jerald L. Meyer; Tanya E. Harkins

(57) ABSTRACT

A method includes rotating a substrate, supplying a first processing liquid from a first nozzle to the substrate during a first period, and supplying a second processing liquid from a second nozzle to the substrate during a second period. First and second liquid columns are formed by the first and second processing liquids during at least partially overlapped period of the first and second periods, respectively. The shapes and arrangements of the first and second liquid columns satisfy that: at least one of first and second central axis lines of the first and second liquid columns is inclined with respect to a rotational axis line of the substrate, first and second cut surfaces obtained by cutting the first and second liquid columns along a horizontal plane at least partially overlap each other, and any point on the first central axis line is located on the second central axis line.

12 Claims, 15 Drawing Sheets

SUBSTRATE PROCESSING METHOD AND SUBSTRATE PROCESSING APPARATUS

CROSS-REFERENCE TO RELATED APPLICATION

This application is based upon and claims the benefit of priority from Japanese Patent Application No. 2019-006171, filed on Jan. 17, 2019, the entire contents of which are incorporated herein by reference.

TECHNICAL FIELD

The present disclosure relates to a substrate processing method and a substrate processing apparatus.

BACKGROUND

In the manufacture of a semiconductor device, liquid processing such as liquid chemical cleaning, wet etching or the like is performed on a substrate. In such a liquid processing, a plurality of kinds of processing liquids, for example, liquid chemical (e.g., DHF), a rinse liquid (e.g., DIW), and a drying liquid (e.g., IPA) are sequentially supplied to the substrate (for example, see Patent Document 1), Patent Document 1 discloses a technology in which there is an overlap between the end of a period during which a rinse nozzle supplies DIW and the start of a period during which a drying liquid nozzle supplies IPA.

PRIOR ART DOCUMENT

Patent Documents

Patent Document 1: Japanese Laid-Open Patent Publication No. 2017-108190

SUMMARY

According to one embodiment of the present disclosure, there is provided a method of processing a substrate, including: rotating the substrate around a vertical axis in a horizontal posture; supplying a first processing liquid from a first nozzle to a front surface of the rotating substrate during a first supply period; and supplying a second processing liquid from a second nozzle to the front surface of the rotating substrate during a second supply period, wherein the first supply period and the second supply period at least partially overlap each other, and a first liquid column is formed by the first processing liquid discharged from the first nozzle and a second liquid column is formed by the second processing liquid discharged from the second nozzle during the overlapped period, and wherein a shape and an arrangement of the first liquid column, when the discharge of the second processing liquid from the second nozzle, is assumed as being stopped during the overlapped period, and a shape and an arrangement of the second liquid column, when the discharge of the first processing liquid from the first nozzle, is assumed as being stopped during the overlapped period, satisfy certain conditions wherein: at least a second central axis line of a first central axis line, which is a central axis line of the first liquid column, and the second central axis line, which is a central axis line of the second liquid column, is inclined with respect to a rotational axis line of the substrate; a first cut surface and a second cut surface, obtained by cutting the first liquid column and the second liquid column along a horizontal plane including the front surface of the substrate, at least partially overlap each other as viewed in a direction of the rotational axis line; and any point on the first central axis line is located on the second central axis line as viewed in the direction of the rotational axis line.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
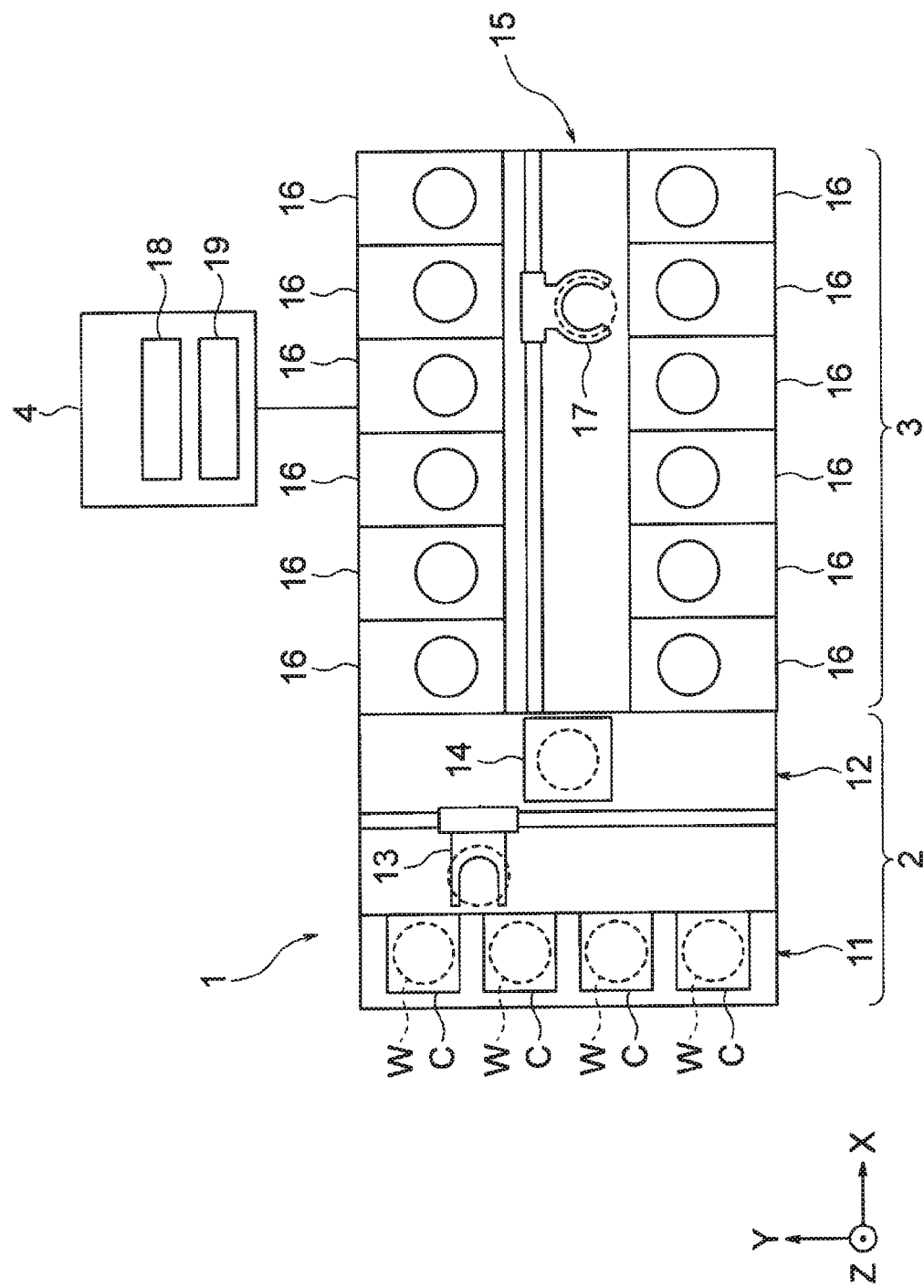
FIG. 1 is a longitudinal sectional view of a substrate processing apparatus according to an embodiment of the present disclosure.

A substrate processing system according to an embodiment of a substrate processing apparatus will now be described with reference to the drawings. FIG. 1 is a diagram illustrating a schematic configuration of a substrate processing system. For the clarification of a positional relationship, an X-axis direction, a Y-axis direction and a Z-axis direction, which are orthogonal to one another, are defined in the following description and a positive Z-axis direction is defined as a vertical upward direction. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As shown in FIG. 1, a substrate processing system 1 includes a loading/unloading station 2 and a processing station 3. The loading/unloading station 2 and the processing station 3 are provided adjacent to each other.

The loading/unloading station 2 includes a carrier stage 11 and a transfer part 12. A plurality of carriers C each which accommodates a plurality of substrates, in this embodiment, semiconductor wafers (hereinafter referred to as wafers W) in a horizontal posture, are placed on the carrier stage 11.

The transfer part 12 is provided adjacent to the carrier stage 11 and includes a substrate transfer device 13 and a delivery part 14 provided therein. The substrate transfer device 13 includes a wafer holding mechanism that holds the wafer W. The substrate transfer device 13 is movable in the horizontal direction and the vertical direction and swingable around a vertical axis, and transfers the wafer W between the carrier C and the delivery part 14 using the wafer holding mechanism.

The processing station 3 is provided adjacent to the transfer part 12. The processing station 3 includes a transfer part 15 and a plurality of processing units 16. The plurality of processing units 16 are provided on both sides of the transfer part 15 in a side-by-side manner.

The transfer part 15 includes a substrate transfer device 17 provided therein. The substrate transfer device 17 includes a wafer holding mechanism that holds the wafer W. The substrate transfer device 17 is movable in the horizontal direction and the vertical direction and swingable around a vertical axis, and transfers the wafer W between the delivery part 14 and each processing unit 16 using the water holding mechanism.

Each of the processing units 16 performs a predetermined substrate processing on the wafer W transferred by the substrate transfer device 17.

The substrate processing system 1 further includes a control device 4. The control device 4 is, for example, a computer, and includes a controller 18 and a storage part 19. The storage part 19 stores a program for controlling various processes to be executed in the substrate processing system 1. The controller 18 controls the operation of the substrate processing system 1 by reading and executing the program stored in the storage part 19.

The program may be recorded in a non-transitory computer-readable storage medium and installed from the storage medium on the storage part 19 of the control device 4. Examples of the computer-readable storage medium may include a hard disk (HD), a flexible disk (FD), a compact disk (CD), a magnetic optical disk (MO), a memory card and the like.

In the substrate processing system 1 configured as above, first, the substrate transfer device 13 of the loading/unloading station 2 takes out the wafer W from the carrier C mounted on the carrier stage 11 and places the same on the delivery part 14. The wafer W placed on the delivery part 14 is picked up from the delivery part 14 by the substrate transfer device 17 of the processing station 3 and loaded into the processing unit 16.

The wafer W loaded into the processing unit 16 is processed by the respective processing unit 16. Thereafter, the processed wafer W is unloaded from the processing unit 16 by the substrate transfer device 17, and then placed on the delivery part 14. Thereafter, the processed wafer W placed on the delivery part 14 is returned to the carrier C of the carrier stage 11 by the substrate transfer device 13.

Next, a configuration of the processing unit 16 will be described.

Figure 2:
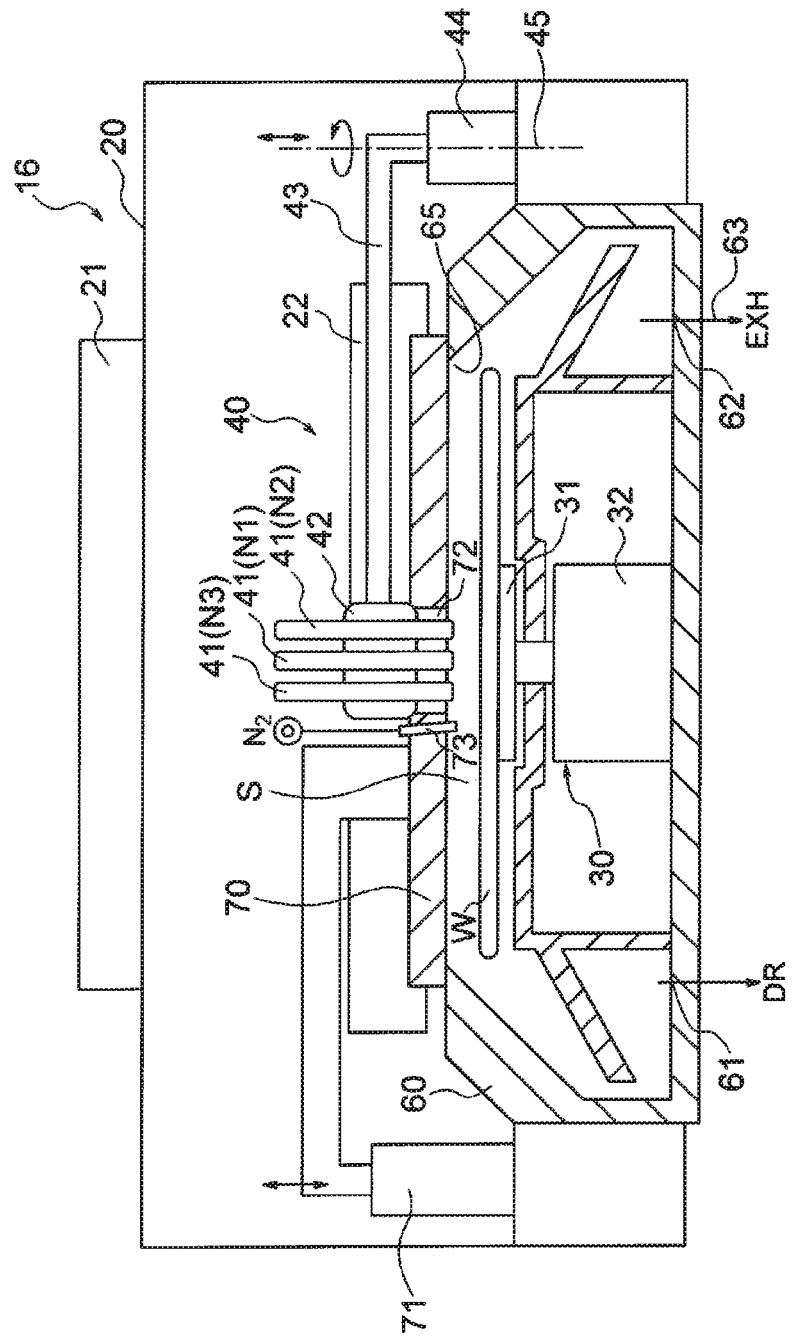
FIG. 2 is a schematic longitudinal cross-sectional view of a processing unit included in the substrate processing apparatus of FIG. 1.

As illustrated in FIG. 2, the processing unit 16 has a chamber (unit casing) 20. A fan filter unit (FFU) 21 is installed on a ceiling portion of the chamber 20. The FFU 21 forms a down-flow inside the chamber 20.

A substrate holding/rotating part 30, which is referred to as a spin chuck or the like, is installed inside the chamber 20. The substrate holding/rotating part 30 includes a chuck 31 (substrate holding element), and a rotary motor 32 configured to rotate the chuck 31. The substrate holding/rotating part 30 is configured to rotate the wafer W as a target substrate around a vertical axis while holding the wafer W in a horizontal posture. The chuck 31 may be a vacuum chuck which attracts a lower surface of the wafer W, or may be a mechanical chuck which holds the periphery of the wafer W by a plurality of gripping claws. The substrate holding/rotating part 30 includes an elevating mechanism (not shown), and is configured to move the chuck 31 up and down by the elevating mechanism.

Various processing liquids are supplied to the wafer W by a processing liquid supply part 40. The processing liquid supply part 40 includes a plurality of (three in the illustrated embodiment) nozzles 41, a nozzle holder 42, a nozzle arm 43, and an arm driving mechanism 44. The three nozzles 41 are fixed to the nozzle holder 42. The nozzle holder 42 is fixed to a leading end of the nozzle arm 43. The arm driving mechanism 44 can move the nozzle arm 43 up and down in the vertical direction and rotate around a vertical axis 45. Accordingly, the nozzles 41 can move between a processing position located directly above the center of the wafer W and a retracted position deviated from above the wafer W. Required processing liquids are supplied to the three nozzles 41 by a processing liquid supply mechanism 50 which will be described later.

A liquid receiving cup 60 is installed inside the chamber 20 so as to surround the periphery of the chuck 31 of the substrate holding/rotating part 30. The liquid receiving cup 60 collects the processing liquids scattering from the rotating wafer W.

A liquid drain port 61 and an exhaust port 62 are installed in the bottom of the liquid receiving cup 60. The processing liquid captured by the liquid receiving cup 60 flows outward of the processing unit 16 through the liquid drain port 61. The captured processing liquid is collected, and reused or discarded in a factory liquid drain system. The atmosphere of an internal space of the liquid receiving cup 60 is discharged to a factory exhaust system kept in a depressurized atmosphere through the exhaust port 62 and an exhaust conduit 63. An ejector (not shown) for promoting the exhaust and a valve (for example, a butterfly valve) for controlling an exhaust flow rate may be installed in the exhaust conduit 63.

The internal structure of the liquid receiving cup 60 is illustrated in FIG. 2 in a significantly simplified manner. The liquid receiving cup 60 may be configured to allow different kinds of processing liquids (for example, acidic liquid chemical, alkaline liquid chemical, and organic liquid chemical) to flow through the interior of the liquid receiving cup 60 via different paths, and to be discharged outward of the processing unit 16 through exhaust ports 62 and exhaust conduits 63 which are different from each other. The processing liquids can be switched through the different paths. This configuration is well known in the technical field of a semiconductor manufacturing apparatus, and therefore, a description thereof will be omitted.

A ceiling plate (top plate) 70 capable of closing an upper opening 65 of the liquid receiving cup 60 is installed inside the chamber 20. The ceiling plate 70 can be moved up and down by an elevating mechanism 71 between a processing position (a position illustrated in FIG. 2) and a retracted position (not shown) above the processing position. The ceiling plate 70 located at the processing position is brought into contact with a peripheral region of the upper opening 65 in the upper surface of the liquid receiving cup 60 so as to close the upper opening 65 of the liquid receiving cup 60. A seal member (not shown) may be installed to seal a gap between the ceiling plate 70 and the liquid receiving cup 60.

When the ceiling plate 70 is raised and retracted to the retracted position, the chuck 31 is raised so that the wafer W can be located above an upper end of the liquid receiving cup 60. In this state, the arm of the substrate transfer device 17 illustrated in FIG. 1 can enter the chamber 20 through a substrate loading/unloading port 22 to transfer the wafer W to and out of the chuck 31. When the ceiling plate 70 is moved up and down, the nozzle holder 42 and the nozzle arm 43 are rotated by the arm driving mechanism 44 and retracted from the position above the ceiling plate 70.

A through-hole 72 is formed in the center of the ceiling plate 70. By moving the nozzle holder 42 up and down by the arm driving mechanism 44, the nozzle holder 42 can be inserted into the through-hole 72 of the ceiling plate 70 located at the processing position, and can be removed from the through-hole 72. When the nozzle holder 42 is inserted into the through-hole 72, the nozzle holder 42 closes the through-hole 72. A seal member (not shown) may be installed to seal a gap between the nozzle holder 42 and the ceiling plate 70.

A gas nozzle 73 for supplying an inert gas (here, a nitrogen gas) to a space S (processing space) between a lower surface of the ceiling plate 70 located at the processing position and an upper surface of the wafer W held by the chuck 31 is installed in the center of the ceiling plate 70. The gas nozzle 73 may be installed at a position different from the illustrated position as long as the gas nozzle 73 can supply the inert gas to the space S.

Next, the three nozzles 41, the nozzle holder 42, and the processing liquid supply mechanism 50 will be described with reference to FIG. 3. Hereinafter, reference symbol "N1" is affixed to a first nozzle, reference symbol "N2" is affixed to a second nozzle, and reference symbol "N3" is affixed to a third nozzle, among the three nozzles 41, so as to distinguish them from one another.

A DHF supply part 51A and a DIW supply part 51B are connected to the first nozzle N1. Either a dilute hydrofluoric acid (DHF) or a pure water (DIW) may be discharged from the first nozzle N1 at a controlled flow rate. An SC1 supply part 52A, a citric acid supply part 52B, and a DIW supply part 52C are connected to the second nozzle N2. Either one of SC1, citric acid, and DIW may be discharged as the processing liquid from the second nozzle N2 at a controlled flow rate. An IPA supply part 53A is connected to the third nozzle N3. Isopropyl alcohol (IPA) may be discharged from the third nozzle N3 at a controlled flow rate.

Figure 3:
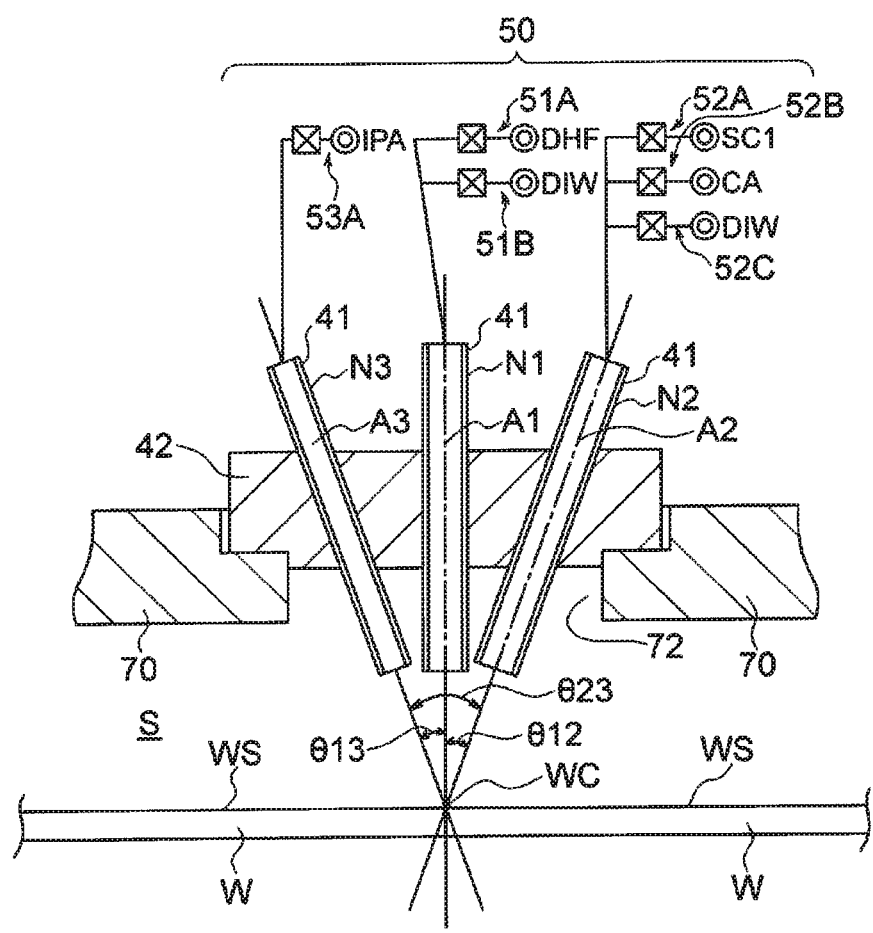
FIG. 3 is a cross-sectional view illustrating arrangement of nozzles.

In the respective supply parts 51A, 51B, 52A, 52B, 52C, and 53A, elements indicated by double circles in FIG. 3 represent sources (for example, factory power, tank, and the like) of the respective liquids. Elements indicated by white squares with "X" written therein in FIG. 3 represent flow control devices. Examples of the flow control devices include an opening/closing valve, a flowmeter, a flow control valve, and the like. Other reference numerals described in FIG. 3 will be described later.

Next, the processing of the wafer W performed in the processing unit 16 will be described. The arm of the substrate transfer device 17 which holds an unprocessed wafer W enters the processing unit 16 through the substrate loading/unloading opening 22. At this time, the nozzles 41 are at the retracted position, the ceiling plate 70 is also at the retracted position, and the chuck 31 of the substrate holding/rotating part 30 is raised to a delivery position. The arm of the substrate transfer device 17 delivers the wafer W to the chuck 31 and is retracted from the processing unit 16. Subsequently, the ceiling plate 70 is lowered to the processing position (the position illustrated in FIG. 2) to close the upper opening 65 of the liquid receiving cup 60. Subsequently, the nozzles 41 move to the processing position (the position illustrated in FIG. 2), and accordingly, the nozzle holder 42 closes the through-hole 72 of the ceiling plate 70. Thus, the internal space of the liquid receiving cup 60 is substantially sealed.

Subsequently, the nitrogen gas is discharged from the gas nozzle 73. The internal space of the liquid receiving cup 60 is always sucked through the exhaust port 62. Therefore, the air inside the liquid receiving cup 60 is substituted with the nitrogen gas so that the internal space of the liquid receiving cup 60 becomes a nitrogen gas atmosphere. Subsequently, the wafer W is rotated by the substrate holding/rotating part 30. The rotation of the wafer W is continuously performed until the processing of one sheet of wafer W is completed. By rotating the wafer W in this way, the nitrogen gas supplied to the region above the center of the wafer W in the space S uniformly flows toward above the periphery of the wafer W.

Thereafter, various processing liquids are supplied to the wafer W. The supply of the processing liquids will be described with reference to a time chart illustrated in FIG. 7. The first to third nozzles N1, N2, and N3 discharge the processing liquids toward or near the center WC (rotational center) of the wafer W (details thereof will be described later). DHF, SC1, and citric acid are cleaning liquid chemicals for removing a removal target existing on a front surface WS of the wafer W. DIW is supplied as a rinse liquid for removing, from the front surface WS of the wafer W, the liquid chemical (DHF, SC1, or citric acid) which has been supplied directly before the supply of DIW, the byproduct generated by reaction with the respective liquid chemical, or the like. IPA substitutes DIW existing on the front surface WS of the wafer W. IPA, which is an organic solvent having higher volatility and lower surface tension than DIW, serves to promote drying (uniform and rapid drying) and suppress pattern collapse. When the processing liquid supplied from one nozzle (N1 or N2) is switched from a first processing liquid (e.g., DHF) to a second processing liquid (e.g., DIW), the first processing liquid and the second processing liquid are continuously supplied in a substantially seamless manner.

First, the discharge of DHF is started from the first nozzle N1 at time T1. At time T2, the processing liquid discharged from the first nozzle N1 is switched from DHF to DIW. The discharge of DIW from the first nozzle N1 is ended at time T5.

At time T3 before time T5, the discharge of DIW from the second nozzle N2 is started. At time T4 after time T3 and before time T5, the processing liquid discharged from the second nozzle N2 is switched from DIW to SC1.

Furthermore, the processing liquid (DIW discharged for times T8 to T10) last discharged from the nozzle N2 remains in the second nozzle N2 and a pipe connected thereto. Thus, the processing liquid discharged from the second nozzle N2 immediately after time T3 as indicated in the time chart is DIW. However, in a case where a drain mechanism for a residual processing liquid (which is well known) is installed in the second nozzle N2 and a pipe connected to the second nozzle N2, SC1 may be discharged from the second nozzle N2 immediately after time T3.

At time T6, the processing liquid discharged from the second nozzle N2 is switched from SC1 to DIW. At time T7, the processing liquid discharged from the second nozzle N2 is switched from DIW to the citric acid. At time T8, the processing liquid discharged from the second nozzle N2 is switched from the citric acid to DIW. The discharge of DIW from the second nozzle N2 is ended at time T10.

At time T9 before time T10, the discharge of DIW from the first nozzle N1 is started. The discharge of DIW from the first nozzle N1 is ended at time T12. At time T11 before time T12, the discharge of IPA from the third nozzle N3 is started. The discharge of IPA from the third nozzle N3 is ended at time T13.

After time T13, the discharge of the processing liquids from all the nozzles N1, N2, and N3 is stopped and the rotation of the wafer W is continued (specifically, the rotation speed of the wafer W may be increased) so that the wafer W is dried. When the drying of the wafer W is completed, the rotation of the wafer W is stopped. Thereafter, the wafer W is unloaded from the processing unit 16 in a reverse order of loading the wafer W. Thus, a series of processes for one sheet of wafer W is completed.

Figure 7:
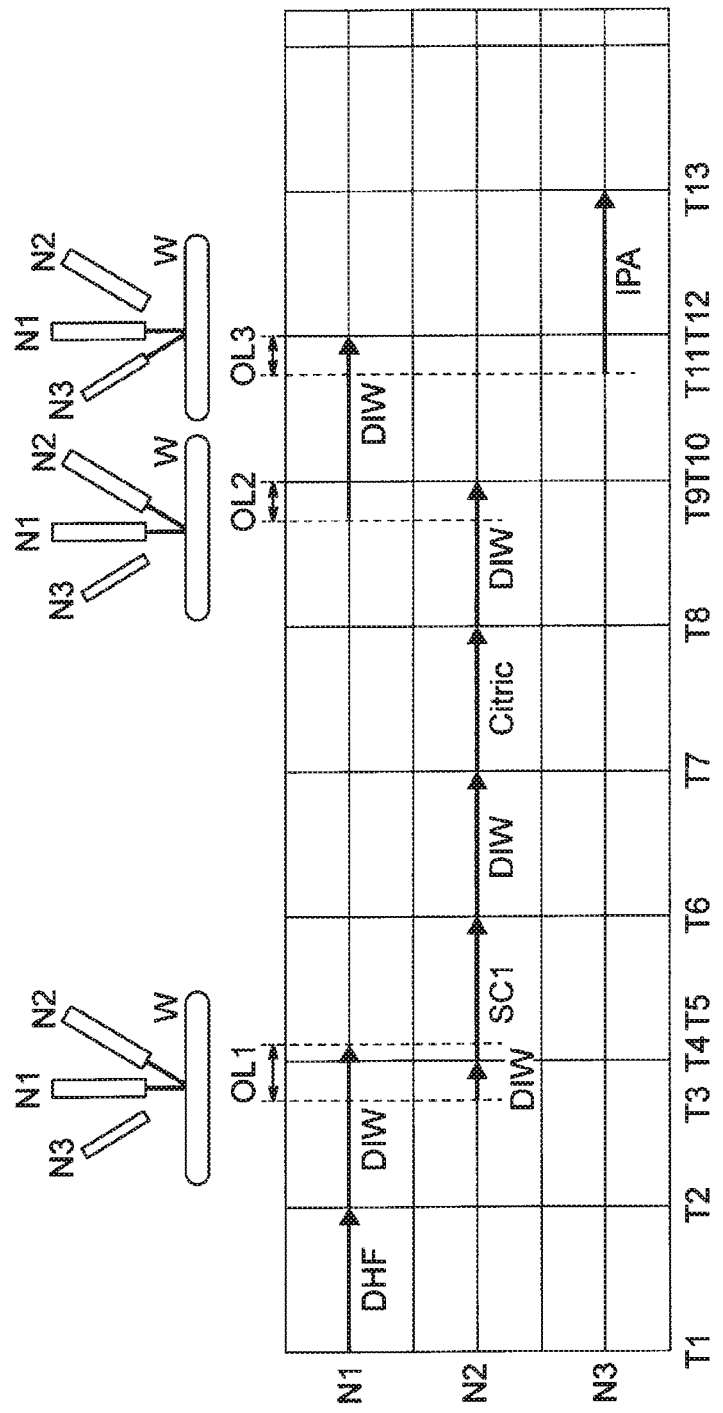
FIG. 7 is a time chart illustrating an example of liquid processing performed by the substrate processing apparatus in FIG. 1.

As can be seen from the time chart illustrated in FIG. 7, during a period OL1 from time T3 to time T5, during a period OL2 from time T9 to time T10, and during a period OL3 from time T11 to time T12, two nozzles (N1 and N2, or N1 and N3) simultaneously discharge the processing liquids. The periods OL1, OL2, and OL3 are referred to as "overlapped periods". If the processing liquids simultaneously discharged from the two nozzles are not in an appropriate relationship, a problem such as liquid splash or non-uniformity of the liquid film formed on the front surface WS of the wafer W may occur. This will be described below.

Various terms defining the arrangement of the respective nozzles 41 (N1, N2, and N3) and the direction of the processing liquids discharged from the nozzles N1, N2, and N3 will be described with reference to FIGS. 3 to 6.

Axis lines of the nozzles N1, N2, and N3 (specifically, axis lines of discharge flow paths near the discharge port) are indicated by A1, A2, and A3, respectively. Liquid columns formed by the processing liquids discharged from the nozzles N1, N2, and N3 are indicated by P1, P2, and P3, respectively. In addition, since gravity acts on the processing liquids discharged from the nozzles N1, N2, and N3, the processing liquids discharged from the inclined nozzles (N2 and N3 in the illustrated example) draw a parabola. However, it is assumed herein that the processing liquids are discharged from the nozzles N1, N2 and N3 with a sufficiently small (e.g., about 20 to 30 mm) distance between the nozzles N1, N2, and N3 and the front surface WS of the wafer W and at a sufficiently large flow rate (liquid force), and thus, the gravity acting on the processing liquids may be ignored. Therefore, it may be regarded that the axis lines of the discharge ports of the nozzles N1, N2, and N3 and the central axis lines of the liquid columns P1, P2, and P3 coincide with each other.

Figure 4:
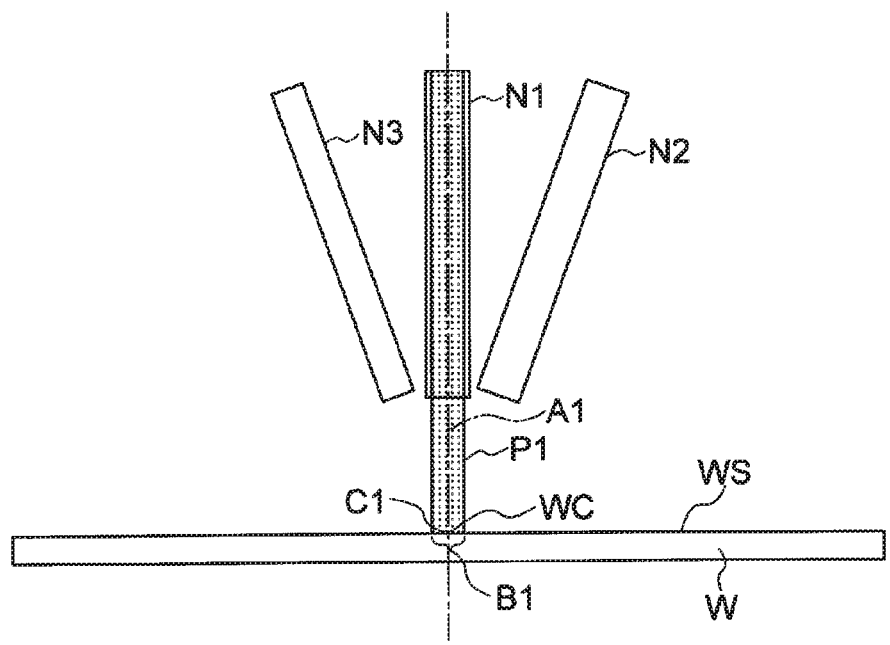
FIG. 4 is a diagram illustrating arrangement of a first nozzle and discharge of a processing liquid.
Figure 5:
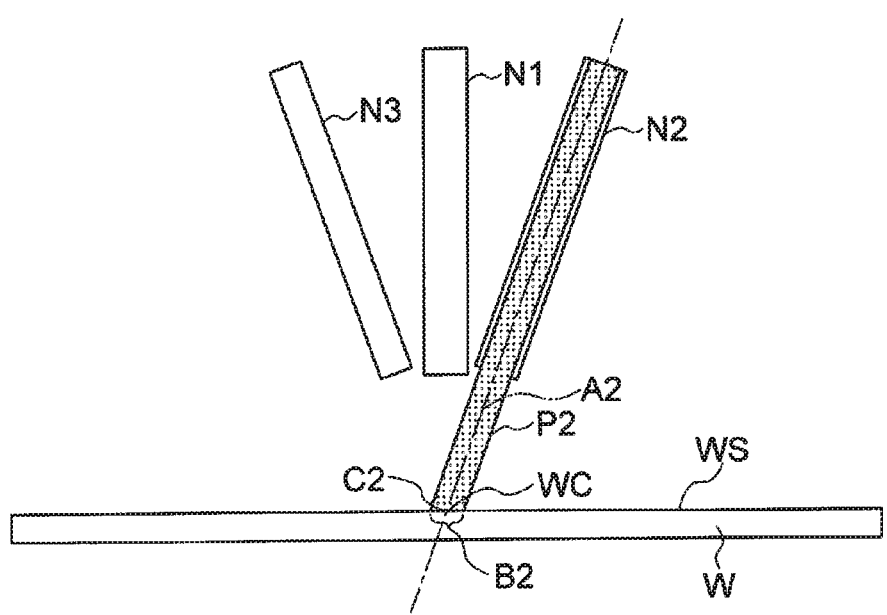
FIG. 5 is a diagram illustrating arrangement of a second nozzle and discharge of a processing liquid.
Figure 6:
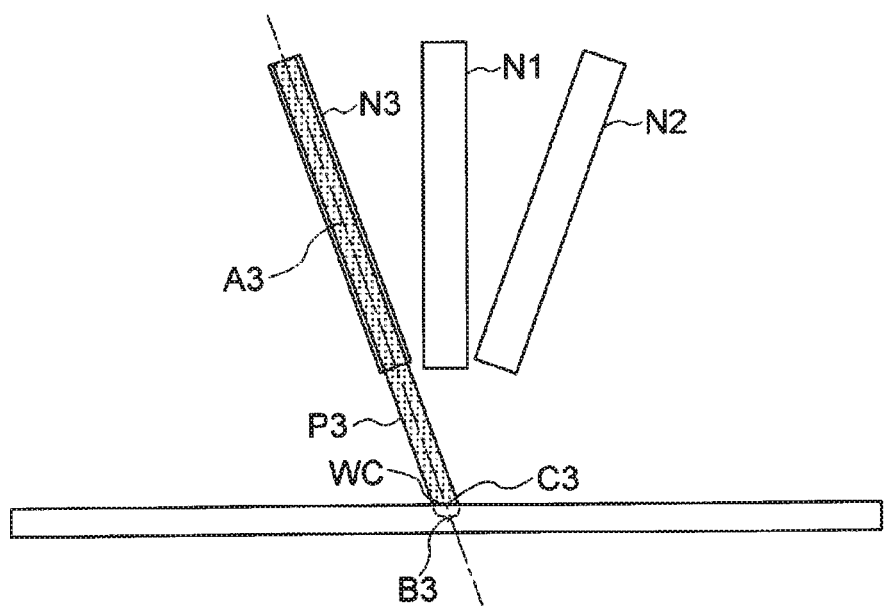
FIG. 6 is a diagram illustrating arrangement of a third nozzle and discharge of the processing liquid.

FIGS. 4, 5 and 6 illustrate a state in which the respective nozzles N1, N2 and N3 independently discharge the processing liquids. Cut surfaces (circular or elliptical) obtained by cutting the liquid columns P1, P2, and P3 of the processing liquids discharged from the respective nozzles N1, N2, and N3 along the plane of the front surface WS of the wafer W are indicated by reference symbols B1, B2, and B3, respectively. Furthermore, the centers of the cut surfaces B1, B2, and B3 are indicated by reference symbols C1, C2, and C3, respectively. The centers C1, C2, and C3 are also intersection points of the axis lines A1, A2, and A3, and the front surface WS.

Figure 8:
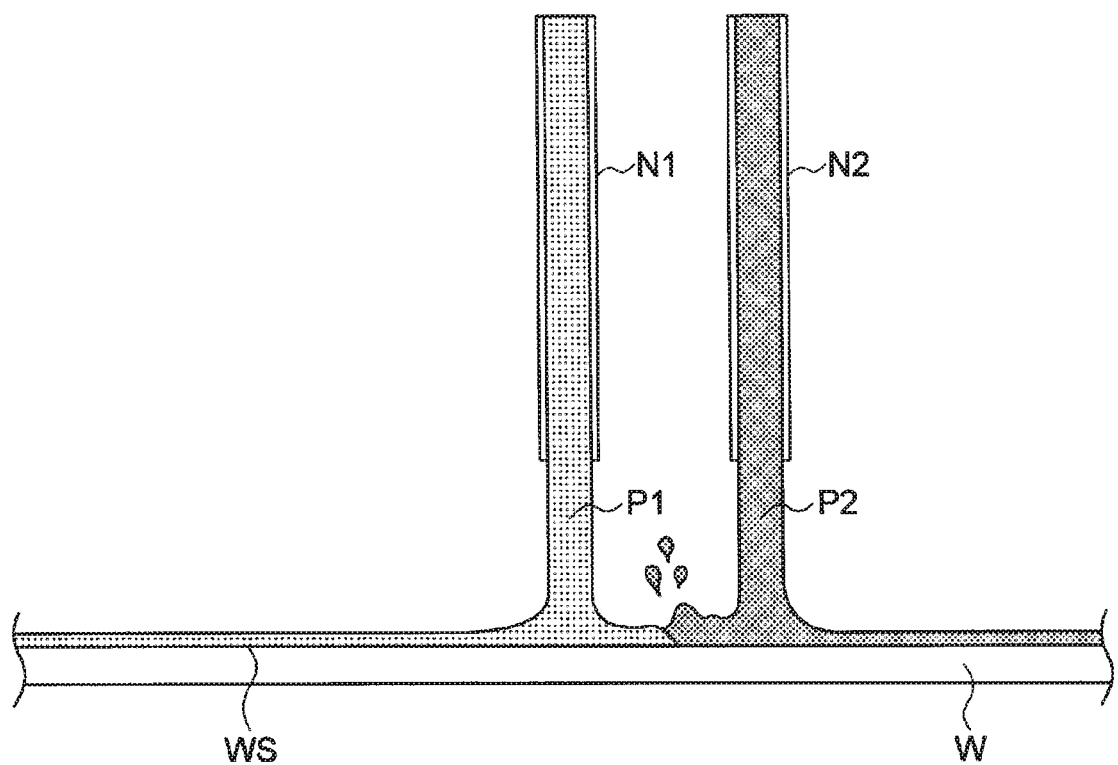
FIG. 8 is a diagram illustrating a related art.

FIG. 8 is a schematic diagram illustrating the related art. The processing liquids are discharged in a direction perpendicular to the front surface WS near the center (rotational center) of the front surface WS of the rotating wafer W from the two nozzles N1 and N2 (see the liquid columns P1 and P2). In addition, positions of the discharged processing liquids deposited on the front surface WS of the wafer W are separated from each other. In this case, liquids, which are trying to spread mainly by virtue of a centrifugal force after being deposited on the front surface WS, collide with each other, so that a liquid film is largely swollen near the collision portion. Furthermore, minute droplets are scattered near the collision portion (occurrence of liquid splash).

The scattered droplets may adhere to surfaces of constituent members of the processing unit 16 (the outer surface of the liquid receiving cup and the lower surface of the ceiling plate). A particle-causing substance may be formed by drying the adhered droplets or allowing droplets of different kinds of processing liquids to react with each other to form the reaction product. In particular, when the lower surface of the ceiling plate 70 is close to the upper surface of the wafer W as in the processing unit 16 illustrated in FIG. 2, especially contamination of the lower surface of the ceiling plate 70 may be problematic.

Furthermore, the swell of the liquid film generated near the collision portion, namely non-uniformity of liquid film thickness, causes thickness non-uniformity of the liquid film formed on the front surface WS of the wafer W by the processing liquids. The in-plane uniformity of processing may be impaired due to the non-uniformity of the liquid film thickness.

In the present embodiment, when the two nozzles (N1 and N2, or N1 and N3) simultaneously discharge the processing liquids, the three nozzles N1, N2, and N3 are arranged so as not to cause the aforementioned problem. Specifically, for example, as illustrated in FIG. 3, the three nozzles N1, N2, and N3 are arranged to have a positional relationship such that the axis lines A1, A2, and A3 intersect with each other at the center (rotational center) WC of the front surface WS of the water W. An angle θ12 formed by the axis line A1 and the axis line A2 is 30 degrees or less (20 degrees in the illustrated example), and an angle θ13 formed by the axis line A1 and the axis line A3 is also 30 degrees or less (20 degrees in the illustrated example). Furthermore, as indicated in the time chart of FIG. 7, since the nozzles N2 and N3 do not simultaneously discharge the processing liquids, the positional relationship between the nozzles N2 and N3 does not matter in the present embodiment.

According to the embodiment illustrated in FIG. 3, it is possible to prevent or at least significantly suppress the problem of liquid splash and non-uniformity of the liquid film thickness.

In addition, there is an allowable range in the positional relationship between the liquid columns of the processing liquids discharged from the nozzles which simultaneously supply the processing liquids. Hereinafter, this will be described with reference to FIGS. 9 to 15 by taking the first liquid column P1 and the second liquid column P2 as an example. Furthermore, it has been found that the allowable range is described by a correlation between the shape and arrangement of the first liquid column P1 when the processing liquid is discharged only from the first nozzle N1, and the shape and arrangement of the second liquid column P2 when the processing liquid is discharged only from the second nozzle N2. In FIGS. 9 to 15, upper diagrams show the liquid columns P1 and P2 as viewed from the direction of a rotational axis line WA (i.e., the vertical axis line) of the wafer W (from directly above), and lower diagrams show the liquid columns P1 and P2 as viewed from the side. Specifically, the lower diagrams show the ones as viewed from the normal direction of the plane including the first central axis line A1 which is the central axis line of the first liquid column P1 and the second central axis line A2 which is the central axis line of the second liquid column P2.

First, mainly from the viewpoint of preventing the liquid splash, it is necessary to at least partially merge at least two liquid columns P1 and P2 prior to depositing on the front surface WS of the wafer W. This requires that at least one (here, the second central axis line A2) of the first central axis line A1 which is the central axis line of the first liquid column P1 and the second central axis line A2 which is the central axis line of the second liquid column P2 should be inclined with respect to the rotational axis line WA of the wafer W (condition 1), and that a first cut surface B1 and a second cut surface B2 obtained by cutting the first liquid column P1 and the second liquid column P2 along a horizontal plane including the front surface WS of the wafer W should at least partially overlap each other as viewed in the direction of the rotational axis line WA (condition 2).

The example of FIG. 8 does not satisfy the conditions 1 and 2, and in this case, the aforementioned problem occurs. Since liquid splash occurs due to the collision between the processing liquids once independently deposited on the front surface WS of the wafer W, it is possible to prevent or at least significantly suppress the liquid splash by satisfying the conditions 1 and 2.

Furthermore, mainly from the viewpoint of preventing non-uniformity of the liquid film thickness, it is required that any point on the first central axis line A1 (i.e., all points on the first central axis line A1) be located on the second central axis line A2, as viewed in the direction of the rotational axis line WA of the wafer W (condition 3).

Figure 9:
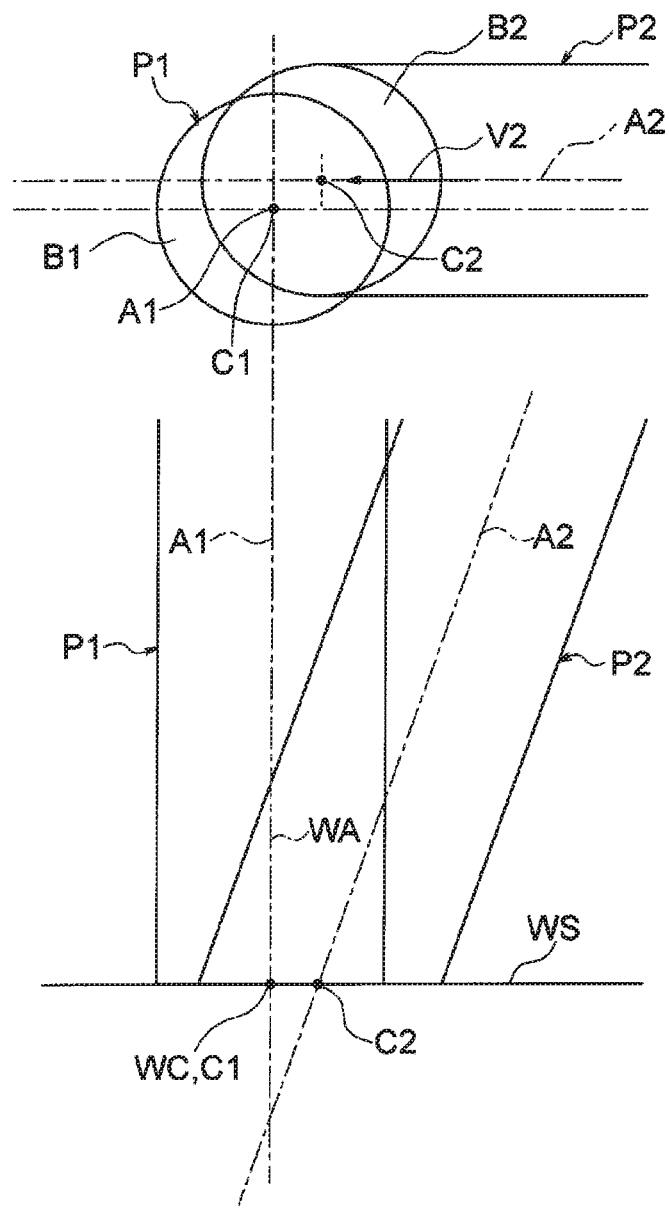
FIG. 9 is a diagram illustrating a relationship between processing liquids discharged from two nozzles.
Figure 10:
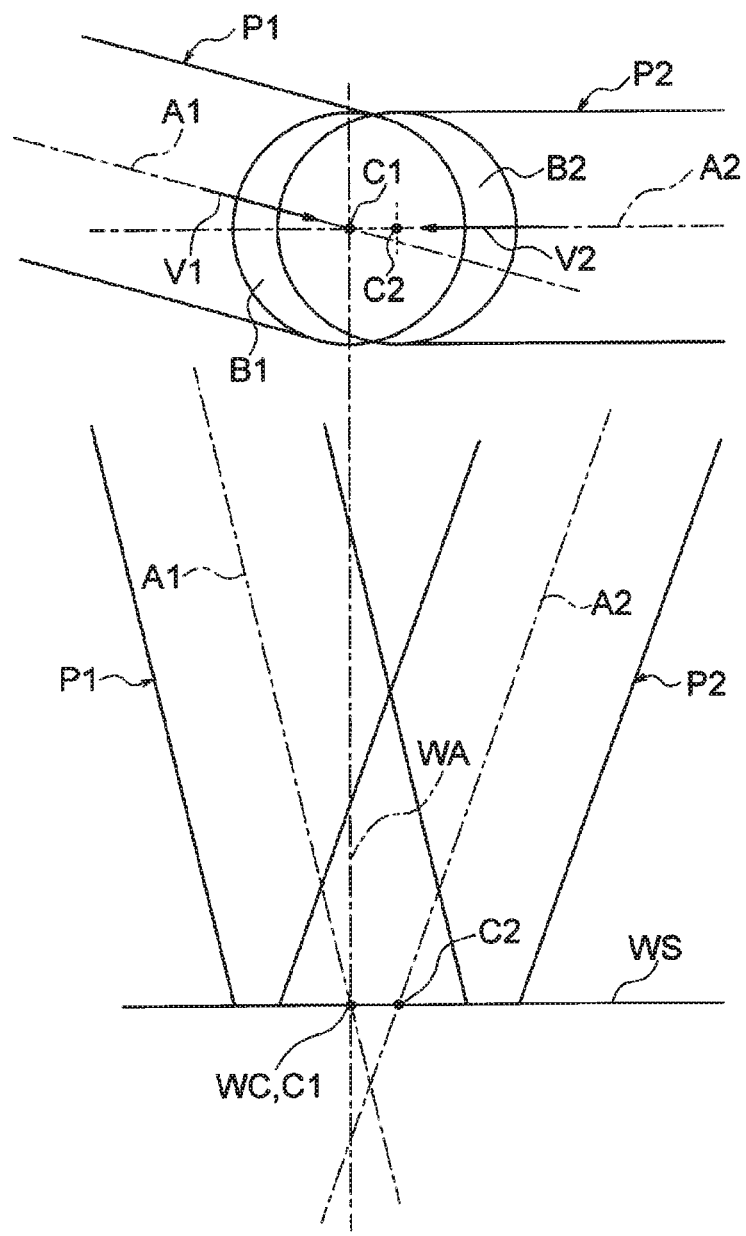
FIG. 10 is a diagram illustrating a relationship between processing liquids discharged from two nozzles.
Figure 11:
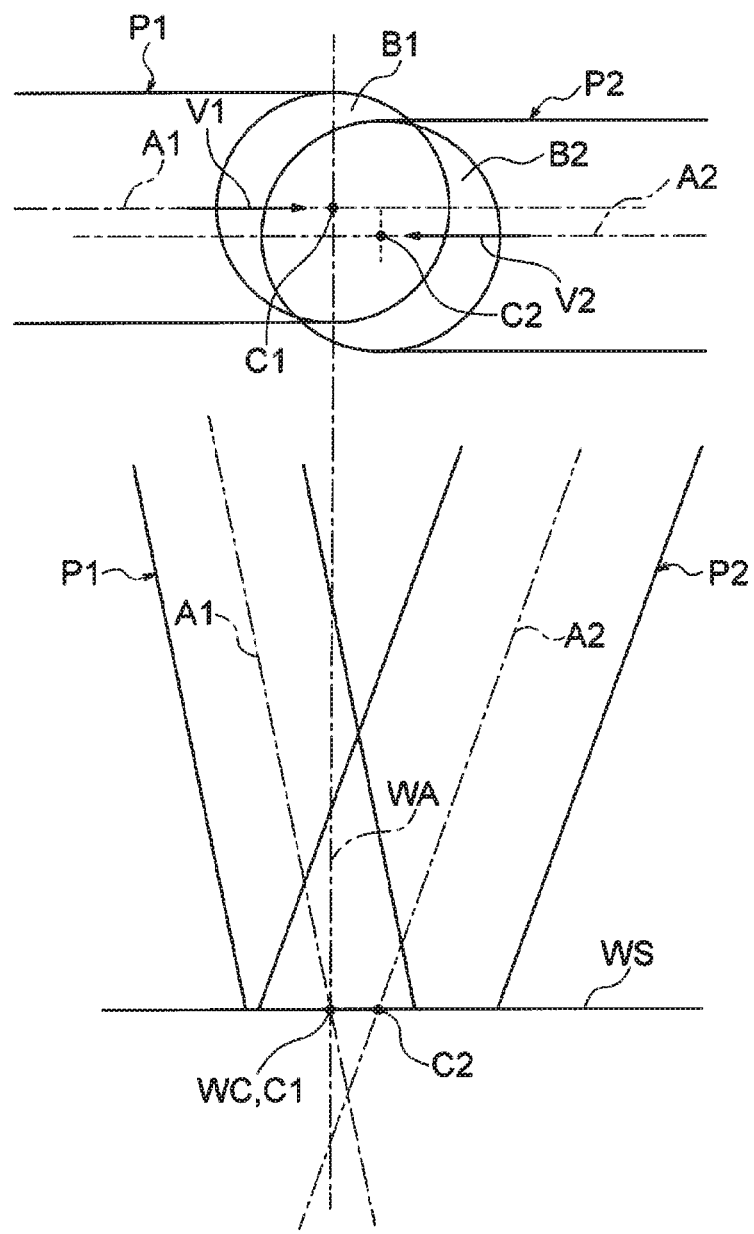
FIG. 11 is a diagram illustrating a relationship between processing liquids discharged from two nozzles.

Hereinafter, the condition 3 will be described with reference to FIGS. 9, 10, and 11 illustrating examples in which the condition 3 is not satisfied. The second central axis line A2 is inclined with respect to the rotational axis line WA of the wafer W under the aforementioned condition 1. Therefore, the second central axis line A2 is a straight line as viewed in the direction of the rotational axis line WA. When the first central axis line A1 is parallel to the rotational axis line WA, the first central axis line A1 appears as a single point as viewed in the direction of the rotational axis line WA (see the upper diagram of FIG. 9). That is, in this case, the condition 3 means that the single point (the first central axis line A1) described above is located on the straight line (the second central axis line 42) described above as viewed in the direction of the rotational axis line WA. The example of FIG. 9 clearly does not satisfy the condition 3.

Furthermore, when both the first central axis line A1 and the second central axis line A2 are inclined with respect to the rotational axis line WA, both the first central axis line A1 and the second central axis line A2 appear as straight lines as viewed in the direction of the rotational axis line WA (see the upper diagrams of FIGS. 10 and 11). That is, in this case, the condition 3 means that the two straight lines are located on the same straight line. It is needless to say that the term "straight line" used herein has an infinite length, and is different from "line segment" and "half line".

In the example of FIG. 10, the two straight lines intersect with each other only at one point as viewed in the direction of the rotational axis line WA. This arrangement does not correspond to "the "any point" on the first central axis line A1 is located on the second central axis line A2 as viewed in the direction of the rotational axis line WA of the wafer W". In the example of FIG. 11, the two straight lines are parallel to each other and do not intersect with each other.

As illustrated on the upper diagrams of FIGS. 10 and 11, horizontal components V1 and V2 of velocity vectors of the processing liquids forming the liquid columns P1 and P2 are not on the same straight line and are directed in different directions as viewed in the direction of the rotational axis line WA. In this case, when the liquid columns P1 and P2 are merged to each other, a vortex is formed. This vortex remains even when the processing liquid spreads toward the peripheral edge of the front surface WS while forming the liquid film after it is deposited on the front surface WS of the wafer W, thus forming a film thickness distribution having a non-uniform vortex shape on the front surface WS of the wafer W. Under such circumstances, the in-plane uniformity of the processing result may be deteriorated. The example of FIG. 9 also has the same problem, but the degree is lighter than those in the cases of FIGS. 10 and 11. By satisfying the aforementioned condition 3, it is possible to prevent or suppress the aforementioned problems and to improve the in-plane uniformity of the processing result. The condition 3 has little influence on the presence or absence of liquid splash.

Furthermore, examples of FIGS. 12 to 15 as described hereinbelow satisfy the condition 3.

Figure 12:
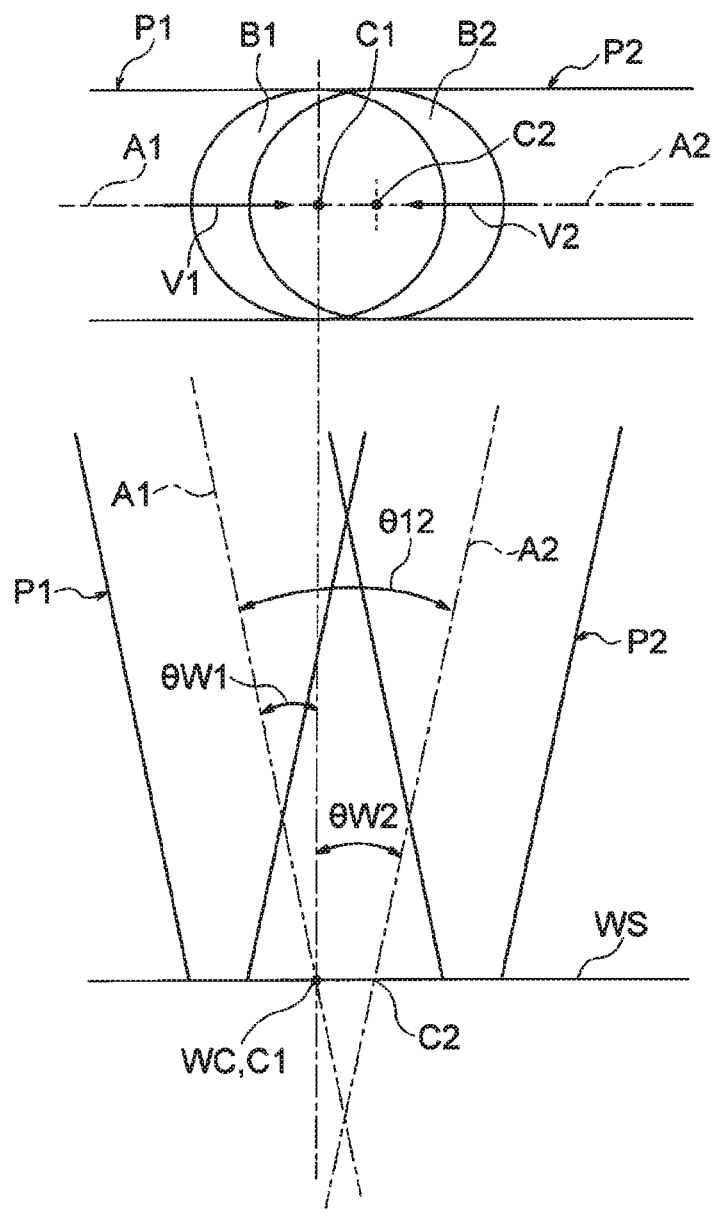
FIG. 12 is a diagram illustrating a relationship between processing liquids discharged from two nozzles.

In addition to the aforementioned condition 3, even if the horizontal components V1 and V2 of the velocity vectors on the same straight line as viewed in the direction of the rotational axis line WA, it is preferable that they not be directed in the same direction (condition 3a). When they are directed in the same direction, a cross-sectional shape of the merged liquid on the front surface WS of the wafer W becomes elliptical with a large flatness having a long axis in the lateral direction in the figure. Then, the processing liquid does not spread uniformly on the front surface WS of the wafer W, causing unevenness of the liquid film. Accordingly, when both the first central axis line A1 and the second central axis line A2 are inclined with respect to the rotational axis line WA, as illustrated in FIG. 12, it is preferable that the horizontal components V1 and V2 are directed in different directions as viewed in the direction of the rotational axis line WA. One of the first central axis line A1 and the second central axis line A2 may be parallel to the rotational axis line WA.

Hereinafter, other conditions, which may be adopted from the viewpoint of preventing or suppressing liquid splash and non-uniformity of liquid film thickness distribution, will be described with reference to FIGS. 12 to 15.

An angle θ12 formed by the first central axis line A1 and the second central axis line A2 may be 30 degrees or less (condition 4). When the first central axis line A1 is parallel to the rotational axis line WA of the wafer W (see FIGS. 13 to 15) or inclined in the same direction as the second central axis line A2 (not shown), if the angle θ12 exceeds 30 degrees, the cross-sectional shape of the merged liquid on the front surface WS of the wafer W becomes elliptical with a large flatness having a long axis in the lateral direction in FIGS. 12 to 15. Then, the processing liquid does not spread uniformly on the front surface WS of the wafer W, causing non-uniformity of the liquid film thickness. Specifically, for example, a fylfot-shaped vortex pattern as illustrated in FIG. 16 is generated, thus resulting in non-uniformity of the liquid film thickness in which the liquid film thickness is large in this portion and the liquid film thickness is small in other portions. Under such circumstances, the in-plane uniformity of the processing result may be deteriorated.

Furthermore, for example, as illustrated in FIG. 12, when the first central axis line A1 is inclined in a direction opposite to the second central axis line A2, if the angle θ12 is larger than 30 degrees, the processing liquids may collide violently. This may cause liquid splash or non-uniformity of the liquid film thickness. Therefore, even in this case, it is preferable that the condition 4 is satisfied.

Moreover, in addition to the aforementioned condition 4, both an angle θW1 (see FIG. 12 for the definition) formed by the rotational axis line WA and the first central axis line A1 and an angle θW2 (see FIG. 12 for the definition) formed by the rotational axis line WA and the second central axis line A2 may be 30 degrees or less (condition 4a). If the angles θW1 and θW2 are increased, even when the first liquid column P1 alone or the second liquid column P2 alone is deposited on the front surface of the wafer W, the aforementioned cut surfaces B1 and B2 become elliptical that is largely flat. This is because the non-uniformity of the liquid film thickness is likely to occur.

Furthermore, in addition to the aforementioned condition 2, for example, as illustrated in FIGS. 12 to 15, it is preferable that the center C1 of the cut surface B1 is in the cut surface B2, and the center C2 of the cut surface B2 is in the cut surface B1 (condition 2a). That is, it is preferable that an overlapping value between the cut surface B1 and the cut surface B2 is sufficiently large, in other words, a distance D12 between the center C1 and the center C2 is sufficiently small. By doing so, it is possible to more reliably prevent liquid splash. Furthermore, it is possible to suppress disturbance of the flow of the processing liquid after merging, which may occur when the overlapping value between the cut surface B1 and the cut surface B2 is small, and to improve the thickness uniformity of the liquid film formed on the front surface WS of the wafer W.

Figure 13:
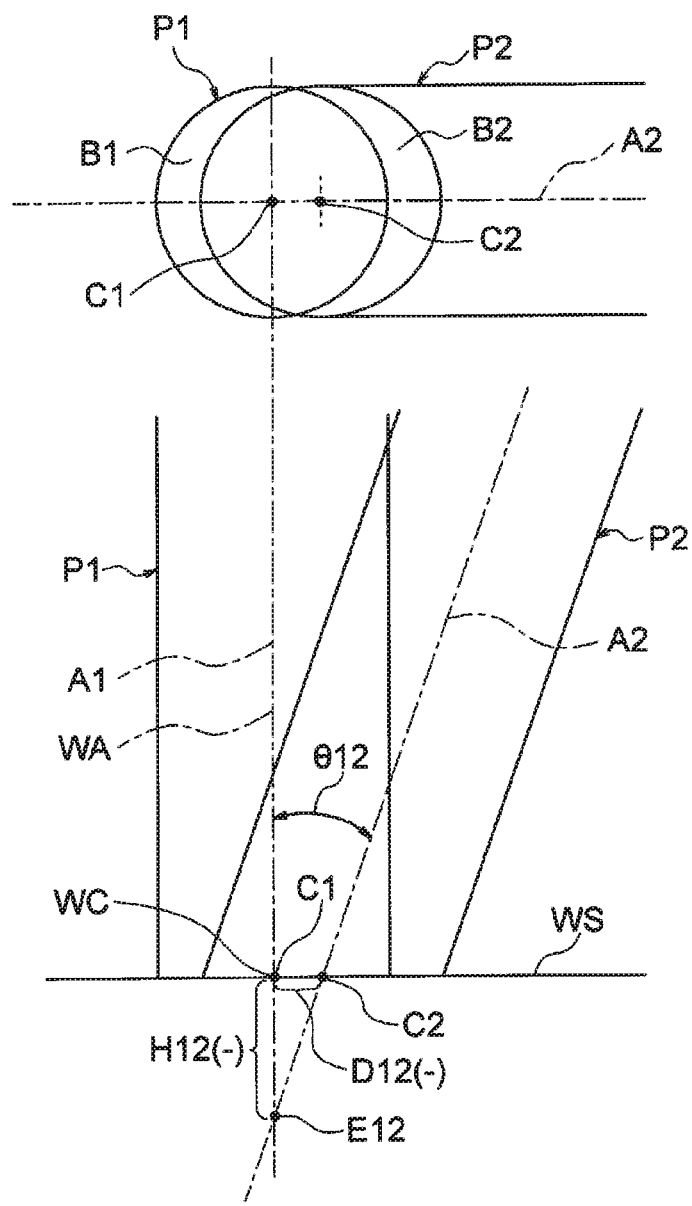
FIG. 13 is a diagram illustrating a relationship between processing liquids discharged from two nozzles.
Figure 14:
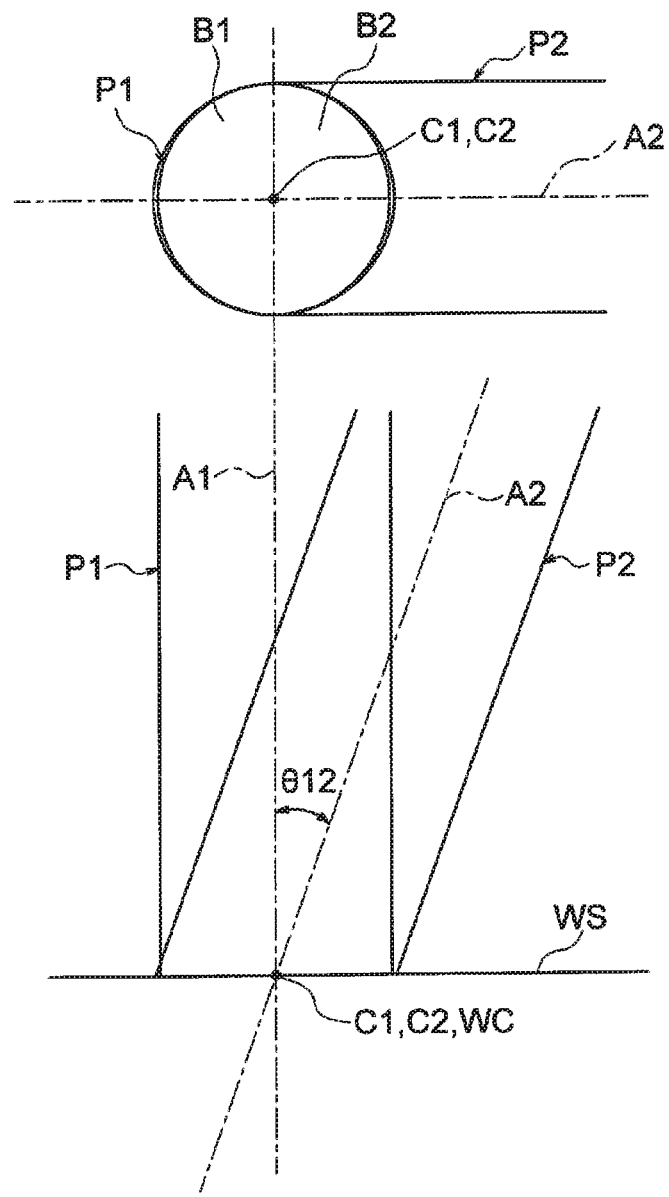
FIG. 14 is a diagram illustrating a relationship between processing liquids discharged from two nozzles.
Figure 15:
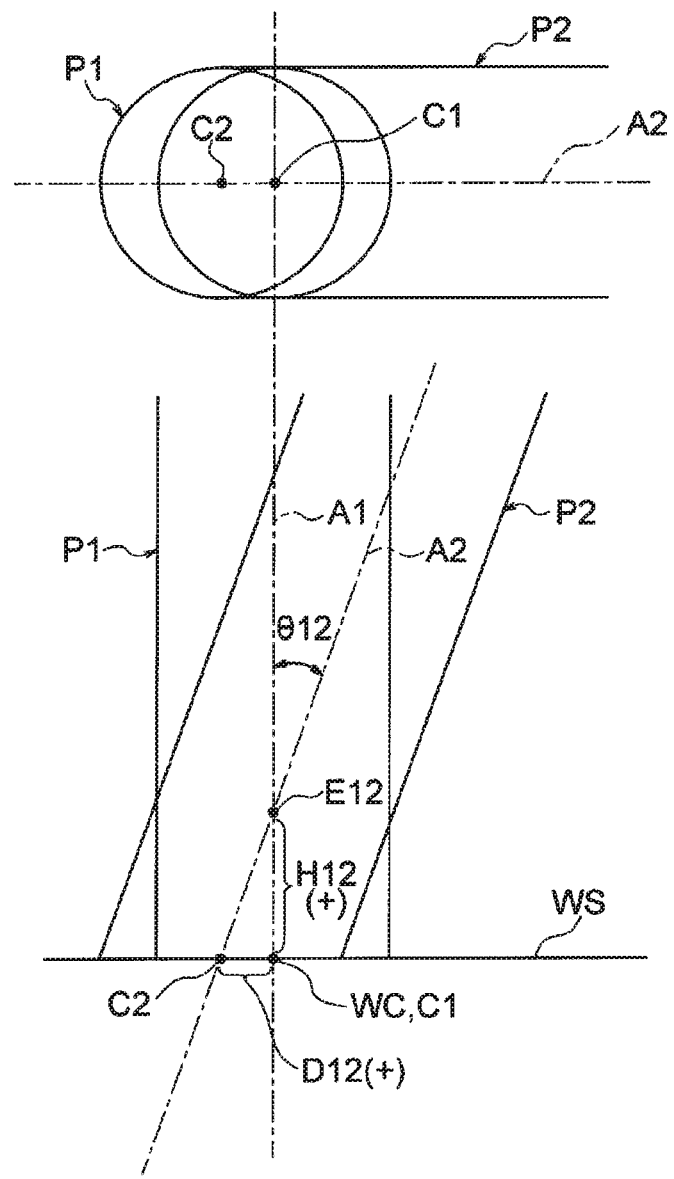
FIG. 15 is a diagram illustrating a relationship between processing liquids discharged from two nozzles.
Figure 16:
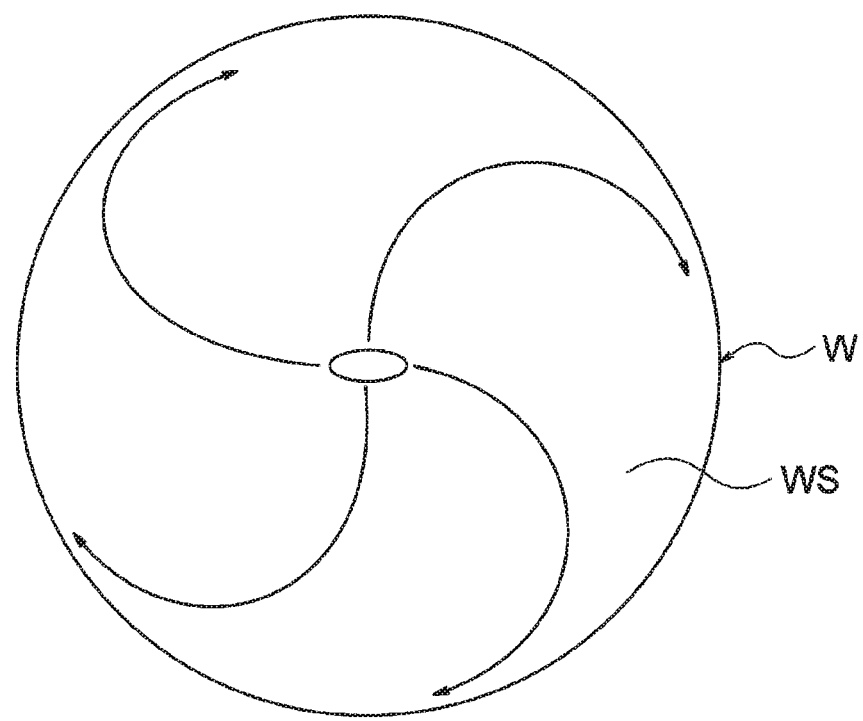
FIG. 16 is a schematic plan view illustrating a problem caused by interference between processing liquids discharged from two nozzles.

In FIGS. 13 and 15, a two-digit number "12" given to the uppercase alphabet indicates a position or distance determined based on a relative positional relationship between the nozzle N "1" and the nozzle N "2". E12 is an intersection point of the axis line A1 with the axis line A2. H12 is a distance (vertical distance) from the front surface WS of the wafer W to the intersection point E12. When the intersection point E12 is at a position lower than the front surface WS, H12 takes a negative value, and when the intersection point E12 is at a position higher than the front surface WS, H12 takes a positive value. C1 is an intersection point of the axis line A1 with the front surface WS of the wafer W. C2 is an intersection point of the axis line A2 with the front surface WS of the wafer W. D12 is a distance (horizontal distance) between the intersection point C1 and the intersection point C2. In the example of FIG. 13, both the distance H12 and the distance D12 are negative values. In the example of FIG. 14, both the distance H12 and the distance D12 (not shown because they are both zero) are zero. In the example of FIG. 15, both the distance H12 and the distance D12 have positive values.

The distance D12 between the center C1 and the center C2 may fall within a range of −2 mm to +2 mm, specifically a range of −1 mm to +1 mm, more specifically 0 mm (i.e., the center C1 and the center C2 coincide with each other) (see FIGS. 3 and 14)) (condition 2b). By doing so, it is possible to more reliably prevent liquid splash and to suppress disturbance of the flow of the processing liquid after merging. Furthermore, a preferable maximum value of the distance D12 depends on the diameters of the liquid column P1 and the liquid column P2. When the diameters of the liquid column P1 and the liquid column P2 are, e.g., about 4.3 to 4.4 mm, if the distance D12 is 2 mm or less, it has been confirmed that good results are obtained.

The distance H12 may fall within a range of −3 mm to +3 mm, specifically a range of −2 mm to +2 mm, more specifically 0 mm (i.e., the center C1 and the center C2 coincide with each other) (see FIG. 3 and FIG. 14) (condition 5). Furthermore, H12 is a value uniquely determined according to θ12 and D12 described above.

When the distance H12 takes a large positive value, the cross-sectional shape of the merged liquid on the front surface WS of the wafer W becomes elliptical that is largely flay having a long axis in the lateral direction in FIG. 11. As a result, the processing liquid does not spread uniformly on the front surface WS of the wafer W, causing unevenness of liquid film. Specifically, for example, a fylfot-shaped vortex pattern as illustrated in FIG. 16 is generated, resulting in the non-uniformity of liquid film thickness in which the liquid film thickness is large in this portion and the liquid film thickness is small in other portions. Under such circumstances, the in-plane uniformity of the processing result may be deteriorated. By satisfying the condition 5, it is possible to prevent occurrence of such an event and to improve the in-plane uniformity of the processing result. The condition 5 has little influence on the presence or absence of liquid splash.

On the other hand, when the absolute value of the distance H12 is a large negative value, the same problem occurs as when the distance D12 is increased.

A specific example of the arrangement of the nozzles and various process conditions used in actual operation will be described with reference to FIG. 3. In this specific example, the three nozzles N1, N2, and N3 are arranged to have a positional relationship such that the first axis line A1, the second axis line A2, and the third axis line A3 intersect with each other at the center (rotational center) WC of the front surface WS of the wafer W. The first axis line A1 extends in the vertical direction, namely parallel to the rotational axis line WA of the wafer W. The angle θ12 formed by the first axis line A1 and the second axis line A2 is 20 degrees, and the angle θ13 formed by the first axis line A1 and the third axis line A3 is also 20 degrees. The diameters of the nozzles N1 and N2 are both 6.4 mm, and the diameter of the nozzle N3 is 3.2 mm. Accordingly, the diameter of the first liquid column P1 and the diameter of the second liquid column P2 are substantially the same, and the diameter of the third liquid column P3 is smaller than the diameters of the first liquid column P1 and the second liquid column P2. The flow rates of DHF and DIW discharged from the nozzle N1 are both in the range of 1,000 to 1,500 mL/min. The flow rates of SC1, citric acid and DIW discharged from the nozzle N2 are all in the range of 1,000 to 1,500 mL/min. The flow rate of IPA discharged from the nozzle N3 is in the range of 75 to 350 mL/min. The revolution per minute of the wafer W is 1,000 to 1,500 rpm. Under the aforementioned conditions, even when the processing liquids are simultaneously discharged from the nozzles N1 and N2 and the processing liquids are simultaneously discharged from the nozzles N1 and N3, it has been confirmed that the occurrence of liquid splash and non-uniformity of liquid film which are problematic do not occur.

DHF, which is likely to have a problem of coverage characteristics (surface coverage characteristics of liquid film) when supplied to the wafer W alone, is preferably discharged from the nozzle N1 (because the first axis line A1 extends in the vertical direction) which enables the most uniform liquid film formation. SCI, citric acid, and IPA do not have a problem of coverage characteristics even when they are discharged from any nozzle. In consideration of this, the kinds of the processing liquids to be discharged from the nozzles N1, N2, and N3 are determined.

Furthermore, the nozzles (N1, N2, and N3) which discharge the processing liquids at the maximum flow rate may not be nozzles whose axis lines (A1, A2, and A3) are oriented in the vertical direction. Even if the nozzle whose axis line is inclined discharges the processing liquid at a larger flow rate than that of the nozzle whose axis line is oriented in the vertical direction, the problem of liquid splash and liquid film non-uniformity does not occur as long as the aforementioned conditions are satisfied.

According to the aforementioned embodiments, even if the processing liquids are simultaneously discharged from the two nozzles, there is no case where the problem of liquid splash and film thickness non-uniformity occurs. Therefore, the members (e.g., the ceiling plate) near the wafer W are not contaminated by mist generated by liquid splash. In addition, since a liquid film having a uniform thickness is formed, liquid processing having high in-plane uniformity can be performed.

In the aforementioned embodiments, the nozzles N1, N2, and N3 supply the processing liquids in a state where they are stationary above the center of the wafer W, but the present disclosure is not limited thereto. For example, in a case where the substrate processing apparatus has no ceiling plate, the substrate processing apparatus may discharge the processing liquids while moving (scanning) between a position above the center of the wafer W and a position above the peripheral edge of the wafer W. Also, in this case, when the processing liquids are simultaneously discharged from the two nozzles, it is preferable that the nozzles are kept stationary above the center of the wafer W.

In the aforementioned embodiments, the two nozzles N1 and N2 are held by the common nozzle holder and arm, but the present disclosure is not limited thereto. The first nozzle N1 may be held by a first nozzle holder and a first nozzle arm, and the second nozzle N2 may be held by a second nozzle holder and a second nozzle arm. In this case, when the processing liquids are simultaneously discharged from the first nozzle N1 and the second nozzle N2, the first nozzle N1 and the second nozzle N2 may be arranged to have the same position relationship with the aforementioned embodiments by moving each of the first and second nozzle arms.

In the aforementioned embodiments, the target substrate is a semiconductor wafer, but the present disclosure is not limited thereto. The substrate may be any type of substrate used in the manufacture field of semiconductor device, such as a glass substrate or a ceramic substrate.

According to the present disclosure in some embodiments, it is possible to prevent or at least significantly suppress liquid splash which is caused by mutual interference between a first processing liquid and a second processing liquid and/or non-uniformity of liquid film thickness of processing liquids formed on a substrate when the first processing liquid and the second processing liquid are simultaneously supplied onto the substrate from different nozzles.

It should be noted that the embodiments disclosed herein are exemplary in all respects and are not restrictive. The above-described embodiments may be omitted, replaced or modified in various forms without departing from the scope and spirit of the appended claims.

What is claimed is:

1. A method of processing a substrate, comprising:
rotating the substrate around a vertical axis in a horizontal posture;
starting a supply of a first processing liquid from a first nozzle to a front surface of the rotating substrate;
stopping the supply of the first processing liquid;
starting a supply of a second processing liquid from a second nozzle to the front surface of the rotating substrate;
stopping the supply of the second processing liquid;
arranging a liquid receiving cup around the rotating substrate;
receiving at least one of the first processing liquid and the second processing liquid scattering from the rotating substrate by the liquid receiving cup;
covering an upper opening of the liquid receiving cup with a ceiling plate; and
supplying an inert gas to a space between the ceiling plate and the rotating substrate during at least a portion of a first supply period, which is a period between starting and stopping the supply of the first processing liquid, and a second supply period, which is a period between starting and stopping the supply of the second processing liquid,
wherein the first supply period and the second supply period at least partially overlap each other, and a first liquid column is formed by the first processing liquid discharged from the first nozzle and a second liquid column is formed by the second processing liquid discharged from the second nozzle during the overlapped period, and
wherein a first central axis line and a first cut surface of the first liquid column, when the discharge of the second processing liquid from the second nozzle is assumed as being stopped during the overlapped period, and a second central axis line and a second cut surface of the second liquid column, when the discharge of the first processing liquid from the first nozzle is assumed as being stopped during the overlapped period, satisfy conditions as follows:
at least one of the first central axis line, which is a central axis line of the first liquid column, and the second central axis line, which is a central axis line of the second liquid column, is inclined with respect to a rotational axis line of the substrate;
the first cut surface and the second cut surface, obtained by cutting the first liquid column and the second liquid column along a horizontal plane including the front surface of the substrate, at least partially overlap each other as viewed in a direction of the rotational axis line; and
all points on the first central axis line are located on the second central axis line as viewed in the direction of the rotational axis line.

2. The method of claim 1, wherein the first central axis line is inclined with respect to the vertical axis.

3. The method of claim 2, wherein the first processing liquid and the second processing liquid are the same kind of processing liquids or different kinds of processing liquids, and the first supply period is a period before or after the second supply period.

4. The method of claim 1, wherein the first central axis line is parallel to the vertical axis.

5. The method of claim 4, wherein the first processing liquid and the second processing liquid are the same kind of processing liquids or different kinds of processing liquids, and the first supply period is a period before or after the second supply period.

6. The method of claim 1, wherein the first central axis line and the second central axis line intersect with each other at an angle of 30 degrees or less.

7. The method of claim 1, wherein a center of the first cut surface is in the second cut surface, and a center of the second cut surface is in the first cut surface.

8. The method of claim 1, wherein a distance between a center of the first cut surface and a center of the second cut surface is 2 mm or less.

9. The method of claim 1, wherein a vertical distance from an intersection point of the first central axis line with the second central axis line to the front surface of the substrate is 3 mm or less.

10. The method of claim 1, wherein the first nozzle and the second nozzle are fixed to a common nozzle holder so as not to be movable relative to each other.

11. The method of claim 1, wherein the first processing liquid and the second processing liquid are the same kind of processing liquids or different kinds of processing liquids, and the first supply period is a period before or after the second supply period.

12. The method of claim 1, wherein the first nozzle and the second nozzle are fixed to the ceiling plate so as not to be movable relative to each other, or the first nozzle and the second nozzle are fixed to a nozzle holder so as not to be movable relative to each other, and wherein the nozzle holder is inserted into an opening formed in a central portion of the ceiling plate.

* * * * *